US009575146B2

United States Patent
Van Den Brink et al.

(10) Patent No.: US 9,575,146 B2
(45) Date of Patent: Feb. 21, 2017

(54) METHOD OF CHARACTERIZING

(75) Inventors: Johan Van Den Brink, Meteren (NL); Ingmar Graesslin, Boenningstedt (DE); Sascha Krueger, Hamburg (DE); Steffen Weiss, Hamburg (DE); Peter Vernickel, Hamburg (DE)

(73) Assignee: KONINKLIJKE PHILIPS ELECTRONICS N.V., Eindhoven (NL)

( * ) Notice: Subject to any disclaimer, the term of this patent is extended or adjusted under 35 U.S.C. 154(b) by 941 days.

(21) Appl. No.: 13/882,293

(22) PCT Filed: Oct. 26, 2011

(86) PCT No.: PCT/IB2011/054771
§ 371 (c)(1),
(2), (4) Date: Apr. 29, 2013

(87) PCT Pub. No.: WO2012/059845
PCT Pub. Date: May 10, 2012

(65) Prior Publication Data
US 2013/0241553 A1 Sep. 19, 2013

Related U.S. Application Data

(60) Provisional application No. 61/508,742, filed on Jul. 18, 2011.

(30) Foreign Application Priority Data

Nov. 2, 2010 (EP) .................................... 10189623

(51) Int. Cl.
*G01R 33/36* (2006.01)
*G01R 33/24* (2006.01)
(Continued)

(52) U.S. Cl.
CPC .............. *G01R 33/36* (2013.01); *G01R 33/246* (2013.01); *G01R 33/44* (2013.01); *G01R 33/5612* (2013.01); *G01R 33/583* (2013.01)

(58) Field of Classification Search
CPC ....... G01R 33/36; G01R 33/44; G01R 33/246; G01R 33/583; G01R 33/5612
See application file for complete search history.

(56) References Cited

U.S. PATENT DOCUMENTS

| 4,284,950 A | 8/1981 | Burl et al. |
| 4,623,843 A | 11/1986 | Macovski |

(Continued)

FOREIGN PATENT DOCUMENTS

JP 61095237 A 5/1986

OTHER PUBLICATIONS

Barmet, C., Zanche, N.D. and Pruessmann, K. P. (2008), "Spatiotemporal magnetic field monitoring for MR". Magn Reson Med, 60: 187-197. doi: 10.1002/mrm.21603.

(Continued)

*Primary Examiner* — Dixomara Vargas

(57) ABSTRACT

The invention relates to a method of characterizing the RF transmit chain of a magnetic resonance imaging scanner (1) using a local transmit/receive coil system (204; 210), comprising a first local NMR probe and a first local magnetic resonance coil, the first NMR probe being spatially located in immediate neighborhood to the first coil, a local receive coil system (206; 208), comprising a second local NMR probe and a second local magnetic resonance coil, the second NMR probe being spatially located in immediate neighborhood to the second coil, wherein the transmit chain comprises an external MR coil (9; 11; 12; 13), the method comprising: determining with the first magnetic resonance coil, a first MR signal phase evolution of the local RF (Continued)

transmit field generated by MR excitation of the first probe using the first magnetic resonance coil by measuring the RF response of the first probe upon said excitation, determining with the second magnetic resonance coil a second MR signal phase evolution of the local RF transmit field generated by MR excitation of the second probe using the external MR coil (9; 11; 12; 13) by measuring the RF response of the second probe upon said excitation, calculating a phase offset between the first and second MR signal phase evolution.

20 Claims, 2 Drawing Sheets

(51) Int. Cl.
*G01R 33/44* (2006.01)
*G01R 33/561* (2006.01)
*G01R 33/58* (2006.01)

(56) References Cited

U.S. PATENT DOCUMENTS

| | | | | |
|---|---|---|---|---|
| 5,144,235 | A * | 9/1992 | Glover | G01R 33/485 324/309 |
| 5,225,781 | A * | 7/1993 | Glover | G01R 33/485 324/309 |
| 5,233,298 | A * | 8/1993 | Dumoulin | G01R 33/563 324/304 |
| 5,321,359 | A * | 6/1994 | Schneider | G01R 33/3875 324/307 |
| 5,446,384 | A * | 8/1995 | Dumoulin | G01R 33/4828 324/307 |
| 6,483,308 | B1 * | 11/2002 | Ma | G01R 33/4828 324/307 |
| 6,507,190 | B1 | 1/2003 | Hinks et al. | |
| 6,566,873 | B1 * | 5/2003 | Smith | G01R 33/441 324/300 |
| 6,750,650 | B2 * | 6/2004 | Kiefer | G01R 33/56563 324/307 |
| 6,841,997 | B2 * | 1/2005 | Feiweier | G01R 33/4828 324/307 |
| 7,109,705 | B2 * | 9/2006 | Smith | G01R 33/441 324/300 |
| 7,208,951 | B2 | 4/2007 | Pruessmann et al. | |
| 7,408,346 | B2 * | 8/2008 | Szyperski | G01R 33/4616 324/307 |
| 7,777,485 | B2 | 8/2010 | Dumoulin et al. | |
| 8,248,070 | B1 * | 8/2012 | Wheaton | G01R 33/4828 324/307 |
| 8,497,681 | B2 * | 7/2013 | Feiweier | G01R 33/56518 324/309 |
| 8,934,694 | B2 * | 1/2015 | Chen | G06T 11/008 382/131 |
| 8,975,895 | B2 * | 3/2015 | Sutton | G01R 33/56341 324/307 |

OTHER PUBLICATIONS

Barmet, C. et al. "A transmit/receive system for magnetic field monitoring of in vivo MRI". Magnetic Resonance in Medicine. vol. 62, Issue 1, pp. 269-276, Jul. 2009.
Katscher U et al. "Transmit SENSE". Magn Reson Med 2003; 49(1): 144-5.
Zhu Y. "Parallel excitation with an array of transmit coils". Magn Reson Med 2004; 51(4):775-84.
Vernickel, P. et al. "Eight-channel transmit/receive body MRI coil at 3T". Magnetic Resonance in Medicine. (2007) vol. 58, Issue 2, pp. 381-389.
Alagappan, V. et al. "Degenerate mode band-pass birdcage coil for accelerated parallel excitation." Magnetic Resonance in Medicine. vol. 57, Issue 6, pp. 1148-1158, Jun. 2007.
Adriany, G. et al. "A geometrically adjustable 16-channel transmit/receive transmission line array for improved RF efficiency and parallel imaging performance at 7 Tesla". Magnetic Resonance in Medicine. vol. 59, Issue 3, pp. 590-597, Mar. 2008.
Hornak, J.P. et al. "Magnetic Field Mapping", Magnetic Resonance in Medicine, vol. 6, No. 2, 1988, pp. 158-163.
Park J-Y, et al. "B1 Mapping Using Phase Information by Frequency-Modulated Pulses". Proceedings of the International Society for Magnetic Resonance in Medicine, 16 Annual Meeting Proceedings, May 3, 2008, p. 361.
Barmet C. et al. "A third-order field camera with microsecond resolution for MR system diagnostics". Proceedings of the International Society for Magnetic resonance in Medicine, 17th Annual Meeting Proceedings, Apr. 18, 2009, p. 781.
Alsop D et al. "In-vivo Mapping of B1 Uniformity Produced by a Whole Body 3T RF Coil". International Society for Magnetic resonance in Medicine. Scientific Meeting and Exhibition, Proceedings, U.S. Apr. 21, 2001, p. 1094.
Overall W.R., et al. "Ensuring Safety of Implanted Devices Under MRI Using Reversed RF Polarizaiton". Magn Reson Med. Magn Reson Med. Sep. 2010;64(3):823-33. doi: 10.1002/mrm.22468.
Krueger, S. Permanent Non-invasive Device Safety Monitoring for Clinical MRI (2008) Proc. Intl Soc Mag Reson Med 16:896.
Graesslin II et al. "Comprehensive RF Safety Concept for Parallel Transmission Systems". Proc Intl Soc Mag Reson Med 16 (2008).
Graesslin I, et al. "Whole Body 3T MRI System with Eight Parallel RF Transmission Channels." Proc Intl Soc Mag Reson Med. 14 (2006), p. 129.
Graesslin I. et al. "Real time SAR Monitoring to Ensure Patient Safety for Parallel Transmission Systems". Proc Intl Soc Mag reson Med 15 (2007) p. 1086.
Nehrke K. "On the steady-state properties of actual flip angle imaging (AFI)" Magn Reson Med Jan. 2009 61(1): 84-92.
Yarnykh, V.L. "Actual flip-angle imaging in the pulsed steady state: a method for rapid three-dimensional mapping of the transmitted radio frequency field". Magn Reson Med 2007 57(1): 192-200.

\* cited by examiner

METHOD OF CHARACTERIZING

This application is a national stage application under 35 U.S.C, §371 of International Application No. PCT/IB2011/054771 filed on Oct. 26, 2011 and published in the English language on May 10, 2012 as International Publication No. WO 2012/059845 A1, which claims priority to European Application No. 10189623.1 filed on Nov. 2, 2010 and to U.S. Application No. 61/508,742 filed on Jul. 18, 2011, the entire disclosures of which are incorporated herein by reference.

TECHNICAL FIELD

The invention relates to a method of characterizing the RF transmit chain of a magnetic resonance imaging scanner, an arrangement for characterizing the RF transmit chain of a magnetic resonance imaging scanner and a computer program product.

BACKGROUND OF THE INVENTION

Image-forming MR methods, which utilize the interaction between magnetic field and nuclear spins in order to form two-dimensional or three-dimensional images are widely used nowadays, notably in the field of medical diagnostics, because for the imaging of soft tissue they are superior to other imaging methods in many respects, they do not require ionizing radiation, and they are usually not invasive.

According to the MR method in general, the body of a patient or in general an object to be examined is arranged in a strong, uniform magnetic field BO whose direction at the same time defines an axis, normally the z-axis, of the coordinate system on which the measurement is based.

The magnetic field produces different energy levels for the individual nuclear spins in dependence on the applied magnetic field strength which spins can be excited (spin resonance) by application of an alternating electromagnetic field (RF field) of defined frequency, the so called Larmor frequency or MR frequency. From a macroscopic point of view the distribution of the individual nuclear spins produces an overall magnetization which can be deflected out of the state of equilibrium by application of an electromagnetic pulse of appropriate frequency (RF pulse) with an effective magnetic field perpendicular to the z-axis, so that the magnetization performs will process about the z-axis.

Any variation of the transverse magnetization can be detected by means of receiving RF antennas, which are arranged and oriented within an examination volume of the MR device in such a manner that the variation of the magnetization is measured in the direction perpendicularly to the z-axis.

In order to realize spatial resolution in the body, switching magnetic field gradients extending along the three main axes are superposed on the uniform magnetic field, leading to a linear spatial dependency of the spin resonance frequency. The signal picked up in the receiving antennas then contains components of different frequencies which can be associated with different locations in the body.

The signal data obtained via the receiving antennas corresponds to the spatial frequency domain and is called k-space data. The k-space data usually includes multiple lines acquired with different phase encoding, resulting from different RF excitations. Each line is digitized by collecting a number of samples. A set of samples of k-space data is converted to an MR image, e.g. by means of the Fast Fourier Transform.

This approach theoretically permits to obtain MR images at high quality when the MR samples are acquired on a perfect rectilinear grid. However, since MRI relies on spatial encoding of magnetic field gradients, any kinds of imperfections in the gradient fields as well as any kinds of imperfections in the main magnetic field lead to deviation of samples from the rectilinear grid, and a variety of MR image defects, including for example image distortions, ghosting, blurring and shifts within the MR images.

Distortions in the main magnetic field may occur for example due to inherent magnetic field imperfections resulting from non-perfect manufacturing of magnets, magnet drifts, heating effects, Eddy current effects etc. Additionally, limited fidelity and bandwidth of gradient amplifiers, coupling among gradient coils and self-induction in gradient coils leads to field perturbations of the magnetic gradient fields which are thus sometimes far from being perfect.

Characterization of the magnetic field using magnetic field monitoring (MFM) probes is known from literature, e.g. from Magn. Res. Med. 60:187-197 (2008) and Magn. Res. Med. 60:176-186 (2008). Magn. Res. Med. 60:187-197 (2008) discusses a method to derive spatiotemporal magnetic field components from data obtained with multiple receive probes placed around the object of interest, inside the magnetic field. It is based on the model assumption that phase variations as observed by the probes results from variations in the magnetic field. However, other sources of phase variations may also be present, like patient physiology induced load variations of the body transmit RF coil.

In its initial form, the MFM probes were receive-only probes, which came with several limitations as discussed in Magn. Res. Med. 62:269-276 (2009). Further, in this paper it was proposed to modify the probes to Transmit-Receive probes, for which the monitored signal phase indeed will reflect the magnetic field induced phase, and be less susceptible to the RF disturbances from the presence of a patient.

SUMMARY OF THE INVENTION

However, for specific applications, like accurate control of RF pulses for UTE, VERSE, or TransmitSENSE applications it is desirable to not only control (predict) the magnetic field response for the gradient system, but also characterize the RF chain in real time.

Here, UTE is understood as Ultrashort Echo Time imaging, using half excitation pulses in two acquired signals that are combined into a single k-space. Here, the data from the two half-excitations must cover exact complementary parts of the slice profile k-space for optimal combination. If the frequency varies between the two acquisitions, artifacts may arise due to mismatch of center k-space.

Further, VERSE is a variable excitation rate pulse design, i.e. adjusting the RF pulse to varying gradient amplitudes. Also here, a perfect match of the gradient and the RF amplitude and phase is required for slice profile control.

Especially parallel transmission in MRI (as for example applied in TransmitSENSE) using a transmission coil array comprising a set of coils (for example 8,16, 32 coils) represents an emerging technology, enabling a variety of interesting applications such as RF shimming and Transmit SENSE to improve the performance of MR especially at high field strengths (Katscher U et al. Magn Reson Med. 2003;49(1):144-5; Zhu Y. Magn Reson Med. 2004;51(4):775-84). In this context, the transmit coil configuration is of crucial importance for the targeted parallel transmit application, and coil setups with different channel count or coil topology have been proposed (Vernickel P et al. Magn Reson Med. 2007;58:381-9; Alagappan V et al. Magn Reson Med. 2007;57:1148-1158; Adriany G et al. Magn Reson Med. 2008;59:590-597). However, this requires B1 mapping and shimming with respect to the target application and anatomy.

B1 mapping is understood as the method of determining transmission coil sensitivities of the transmission coils. Further, shimming is understood as the procedure of adjusting the transmission properties of these coils considering the acquired B1 maps in order to obtain a desired, for example homogeneous transmission profile within a certain spatial MR excitation area in the examination volume.

However, the requirement of good transmission coil shimming and high quality coil shimming requires the acquisition of B1 maps for each individual coil.

From the foregoing it is readily appreciated that there is a need for an improved imaging method. It is consequently an object of the invention to provide an improved method for characterizing the RF transmit chain of a magnetic resonance imaging scanner, even in real time.

The present invention provides a method of characterizing the RF transmit chain of a magnetic resonance imaging scanner using a local transmit/receive coil system, the local transmit/receive coil system comprising a first local NMR probe and a first local magnetic resonance coil, wherein the first NMR probe is spatially located in the immediate neighborhood to the first coil. Further, a local receive coil system is used, wherein the local receive coil system comprises a second local NMR probe and a second local magnetic resonance coil, wherein the second NMR probe is spatially located in the immediate neighborhood to the second coil.

Further, the transmit chain comprises an external MR (magnetic resonance) coil, wherein the method further comprises determining a first MR signal phase evolution of the local RF signal generated by MR excitation of the first probe using the first magnetic resonance coil by measuring the RF response of the first probe upon said excitation, the measurement being performed using the first magnetic resonance coil. Further, the method comprises determining a second MR signal phase evolution of the local RF signal generated by MR excitation of the second probe using the external MR coil by measuring the RF response of the second probe upon said excitation, wherein the measurement is performed using the second magnetic resonance coil. Finally, the method comprises the characterization of the RF transmit chain phase error by calculating a for example time-dependent phase offset between the first MR signal phase evolution and the second MR signal phase evolution.

The method according to the invention has the advantage that variations in the MR signal phase can be separated with respect to loading induced variations due to the presence and even movement of the object to be imaged, as well as variations induced by the gradient system and the main magnet and their respective imperfections.

It has to be noted that generally the phase induced in an MR signal results from an RF pulse frequency offset. Thus, the reason for considering phase errors to characterize the RF transmit chain is that the source of the phase error is a frequency error in the RF chain, resulting in a phase error in the acquired MR signal.

Consequently, influences from human physiology like breathing, movements and cardiac cycles which may result in RF frequency variations that are of low frequency relative to the RF pulse timings can be detected and respective feedback can be provided in real time to the RF transmit chain of the external MR coil for compensation of such variations when transmitting RF fields to the object to be imaged for the purpose of nuclear magnetic resonance excitation. Characterization of the RF transmit chain can for example be implemented in a characterization module, wherein the adjustment is performed using a feedback loop between the characterization module and the RF transmit chain.

The reason for considering MR signal phase evolutions and not only single phases at a given point in time is the following: in case only the frequency offset in the RF chain for an RF pulse with effective zero duration would be required, a single point per calibration would suffice. However, since it is desired to combine the frequency offset determination with a full characterization of the magnetic field(s), the time evolution of the MR signal phase has to be sampled and analyzed. The frequency offset in the first and second probe's signals may then be compared to derive the contribution from the RF transmit coil. In a respective fitting procedure, the other magnetic field terms may be constrained to be equal for the first and second probe. In that case it may be assumed that the frequency offset in the RF pulse is indeed momentarily induced. It is also possible to fit both signals freely and assume that time-dependent RF induced terms can occur.

In accordance with a further embodiment of the invention, the excitation of the first and second probe is performed simultaneously. This has the advantage, that in a highly precise manner the characterization of the RF transmit chain can be performed. No theoretical assumptions between the relationship of signals obtained from the first and second probe are required which thus ensures a high quality of the transmit chain characterization.

In accordance with a further embodiment of the invention, the nuclei excited using the first RF transmit field differ from the nuclei excited using the second RF transmit field. In other words, the two probe systems can be implemented as 'heteronuclear' setups i.e. using different nuclei, one species for the external MR coil and the second receive probes, and a second species for the first local TR (transmit/receive) probes. For example, in case the external MR coil is a volume coil, the volume coil may be sensitive to protons, whereas the local TR probes are sensitive to another nucleus like 19 F.

However, the invention is not limited to different nuclei in terms of different atoms, but the invention may also be applied with respect to different nuclei in terms of substantially different chemical shifts, i.e. different NMR resonance frequencies.

It further has to be noted that the invention may also be performed by means of a two-probe system implemented as a 'homonuclear' setup, i.e. using both the same nucleus like proton or fluorine excited by the RF transmit fields. However, in the latter case excitation of the first and second probe should not be performed simultaneously but subsequently. In another embodiment, the said set of first probes is electromagnetically shielded from being excited by the volume coil. In this case, first and second probe excitation can be performed simultaneously even in the homonuclear setup, using e.g. a block excitation for the first probes and the actual RF excitation pulse for the second probes.

In accordance with an embodiment of the invention, in case the excitation of the first and second probe is performed subsequently, the method further comprises monitoring the timing of said excitation of the first and second probe and aligning the first and second MR signal phase evolutions using the timing of the first and second probe.

In accordance with a further embodiment of the invention, the method further comprises adjusting the RF frequency of the transmit chain for compensation of the phase offset. For example, the characterization of the RF transmit chain may be performed by a characterization module, wherein the adjustment is performed using a feedback loop between the characterization module and the RF transmit chain. Thus, slow variations in the transmit chain can be tracked, the slow variations for example being caused by patient loading variations, such that respective frequency offsets can be tracked prior to a transmit pulse.

In a further aspect of the invention from the the RF responses of the first and second probes, a level of electromagnetic coupling is derived of the individual local MR coils with an object to be examined, compared to a pre-set threshold, and any local MR coil(s) of which the level of coupling with the object exceed(s) the pre-set threshold are (is) deactivated. The level of coupling between a local MR coil (or a RF transmit/receive element) which exceeds the pre-set threshold indicates a potential dangerous situation in that RF heating of the patient by the local MR coil may occur. By de-activating or disconnecting that local MR coil, the danger of RF heating is avoided. The magnetic resonance image is the reconstructed on the basis of the magnetic resonance imaging signals that are acquired by way of the local MR coils for which there is no potential danger and that are actually activated or remain connected. In a multi-channel, e.g. with eight independent channels, the remaining local MR coils usually provide sufficient coverage of the region of interest. Additionally, a quadrature MR body coil may also be employed to acquire the magnetic resonance signals. The coupling to the object by the de-activated local MR coils may be determined from the response of the probe associated with the deactivated local MR coil. Monitoring these coupling levels may be used to re-active or re-connect the local MR coil when a safe condition is reached again. In this aspect of the invention, there is no need to abort the entire MR imaging sequence when danger for RF heating is assessed, but only the local MR coil(s) that are associated with the risk of RF heating are de-activated and the acquisition of magnetic resonance signals can continue with the local MR coils that remain activated/connected.

In a practical implementation the responses of the probes to the RF excitation pulses of an MR imaging sequence may be employed to determine the level of coupling of the local MR coils to the object under examination. Alternatively, the MR imaging sequence may be preceded by a short RF pulse and the coupling level determined from the responses of the probes to the preceding short RF pulse. This provides practical implementations of the monitoring of danger of RF heating in MR imaging sequences. In clinical practice, the present invention shows good results in cardiac exams for a patient with a hip implant.

In another practical implementation, one of the local MR coils is activated to generate the local RF transmit field that generates the responses of the probes. In a further aspect of the invention, each of the local MR coils is activated in turn to emit an RF pulse and the response of all probes to that RF pulse is measured. In this way the so-called system matrix is evaluated that represents the mutual coupling of the local MR coils. For example, when eight independent RF transmit/receive channels are employed, eight RF pulses may be interleaved with the MR imaging sequence. In this way the system matrix is regularly updated without disturbance of the MR imaging sequence. Alternatively, the measurement of the system matrix may be distributed over the imaging sequence. In this implementation, RF pulses to measure the responses of the probes are applied briefly before each of several RF excitation pulse of the MR imaging sequence. When e.g. eight independent RF channels are employed, then eight RF pulses are needed to evaluate the system matrix. This leads to accurate results because changes in coupling of the local MR coils to implants in the body of the patient occur slowly compared to the time required for the RF pulses to evaluate and update the system matrix.

To maintain optimal image quality, the RF shim settings to compensate for spatial inhomogeneities of the RF excitation (B1) field is updated to account for some of the local MR coils having been de-activated or disconnected. The initial RF shim settings are based on a B1-map that is acquired prior to the MR imaging sequence.

In accordance with a further embodiment of the invention, the first and second probe is commonly provided as one single probe. Similarly, in accordance with a further embodiment of the invention, the first coil and the second coil is preferably provided as one single RF coil.

Thus, a large variety of combinations of the number of RF coils and probes is possible. For example, in case the excitation of the first and second probe is performed subsequently, one single probe in combination with one single RF coil may be used to determine
  the first MR signal phase evolution of the local RF transmit field generated by MR excitation of the probe using the MR coil, the first MR signal phase evolution being determined by measuring the RF response of said probe using the above mentioned single RF coil;
  the second MR signal phase evolution of the local RF transmit field generated by MR excitation of the same probe using the external MR coil, the second MR signal phase evolution being determined by measuring the RF response of said probe using the above mentioned single RF coil.

However, it is also possible to use for example a single probe in combination with two different coils (first coil and second coil). Of course, it is also possible to use two different probes in combination with one single RF coil. In case the RF coil is tunable to two different resonance frequencies, it may be possible to perform subsequently MR data acquisition of MR signals acquired from two different nuclei with respective detuning, like 1 H and 19 F.

In accordance with a further embodiment of the invention, the characterization of the RF transmit chain is performed using an MR calibration sequence prior to the execution of an imaging sequence. In other words, the RF transmit chain of the magnetic resonance imaging scanner is characterized prior to a transmit pulse such that in real time variations in the transmit chain for example due to patient loading can be tracked and compensated for.

In accordance with a further embodiment of the invention, the external MR coil is a parallel transmit coil, having multiple independent transmit modes or transmit elements.

In accordance with a further embodiment of the invention, the first and second coils are either spatially located in the immediate neighborhood to each other or spatially located separated from each other, wherein in the latter case the method further comprises relating the first and second coil to each other by a physical model. Thus, in a highly flexible manner the first and second coils may be arranged in the examination volume.

The setup can be extended to a multiple probe location setup, where (up to) every location is implemented as a 'twins' readout.

In another aspect, the invention relates to an arrangement for characterizing the RF transmit chain of a magnetic resonance imaging scanner, the arrangement comprising:
- a local transmit/receive coil system, the local transmit/receive coil system comprising a first local NMR probe and a first local magnetic resonance coil, the first NMR probe being spatially located in immediate neighborhood to the first coil,
- a local receive coil system, the local receive coil system comprising a second local NMR probe and a second local magnetic resonance coil, the second NMR probe being spatially located in immediate neighborhood to the second coil,
- wherein the transmit chain comprises an external MR coil, the arrangement being adapted for:
- determining a first MR signal phase evolution of the local RF transmit field generated by MR excitation of the first probe using the first magnetic resonance coil by measuring the RF response of the first probe upon said excitation, the measurement being performed using the first magnetic resonance coil,
- determining a second MR signal phase evolution of the local RF transmit field generated by MR excitation of the second probe using the external MR coil by measuring the RF response of the second probe upon said excitation, the measurement being performed using the second magnetic resonance coil,
- providing the characterization of the RF transmit chain phase error by calculating a phase offset between the first MR signal phase evolution and the second MR signal phase evolution.

In another aspect, the invention relates to a computer program product comprising computer executable instructions for performing the method according to any of the method steps as described above.

BRIEF DESCRIPTION OF THE DRAWINGS

The enclosed drawings disclose preferred embodiments of the invention. It should be understood, however, that the drawings are designed for the purpose of illustration only and not as a definition of the limits of the invention. In the drawings.

DETAILED DESCRIPTION OF THE EMBODIMENTS

Figure 1:
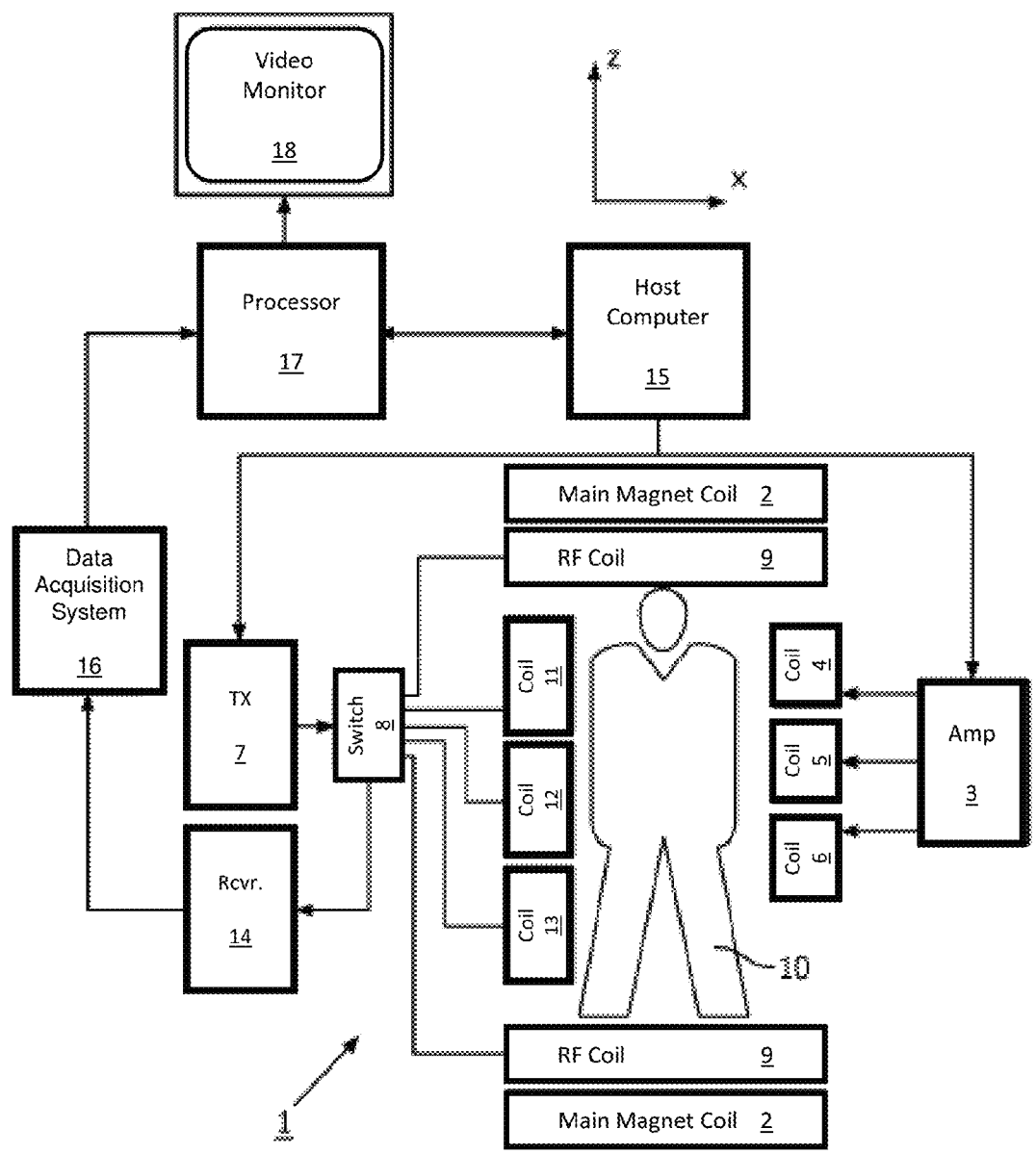
FIG. 1 illustrates a schematic of an MR device according to the invention.

With reference to FIG. 1, an MR imaging system 1 is shown. The system comprises superconducting or resistive main magnet coils 2 such that a substantially uniform, temporarily constant main magnetic field $B_0$ is created along a z-axis through an examination volume.

A magnetic resonance generation manipulation system applies a series of RF pulses and switched magnetic field gradients to invert or excite nuclear magnetic spins, induce magnetic resonance, refocus magnetic resonance, manipulate magnetic resonance, spatially or otherwise encode the magnetic resonance, saturate spins and the like to perform MR imaging.

More specifically, a gradient pulse amplifier 3 applies current pulses to selected ones of whole body gradient coils 4, 5 and 6 along x, y and z-axes of the examination volume. An RF transmitter 7 transmits RF pulses or pulse packets, via a send/receive switch 8 to an RF antenna 9 to transmit RF pulses into the examination volume. A typical MR imaging sequence is composed of a packet of RF pulse sequences of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals may also be picked up by the RF antenna 9.

For generation of MR images of limited regions of the body or in general object 10, for example by means of parallel imaging, a set of local array RF coils 11, 12 and 13 are placed contiguous to the region selected for imaging. The array coils 11, 12 and 13 can be used to receive MR signals induced by RF transmissions effected via the RF antenna. However, it is also possible to use the array coils 11, 12 and 13 to transmit RF signals to the examination volume.

The resultant MR signals are picked up by the RF antenna 9 and/or by the array of RF coils 11, 12 and 13 and are demodulated by a receiver 14 preferably including a preamplifier (not shown). The receiver 14 is connected to the RF coils 9, 11, 12 and 13 via a send/receive switch 8.

A host computer 15 controls the gradient pulse amplifier 3 and the transmitter 7 to generate any of a plurality of imaging sequences, such as echo planar imaging (EPI), echo volume imaging, gradient and spin echo imaging, fast spin echo imaging, UTE, VERSE, or TransmitSENSE applications and the like.

For the selected sequence, the receiver 14 receives a single or a plurality of MR data lines in a rapid succession following each RF excitation pulse. A data acquisition system 16 performs analogue to digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume or the like. The image is then stored in an image memory where it may be accessed for converting slices or other portions of the image representation into appropriate formats for visualization, for example via a video monitor 18 which provides a man readable display of the resultant MR image.

Figure 2:
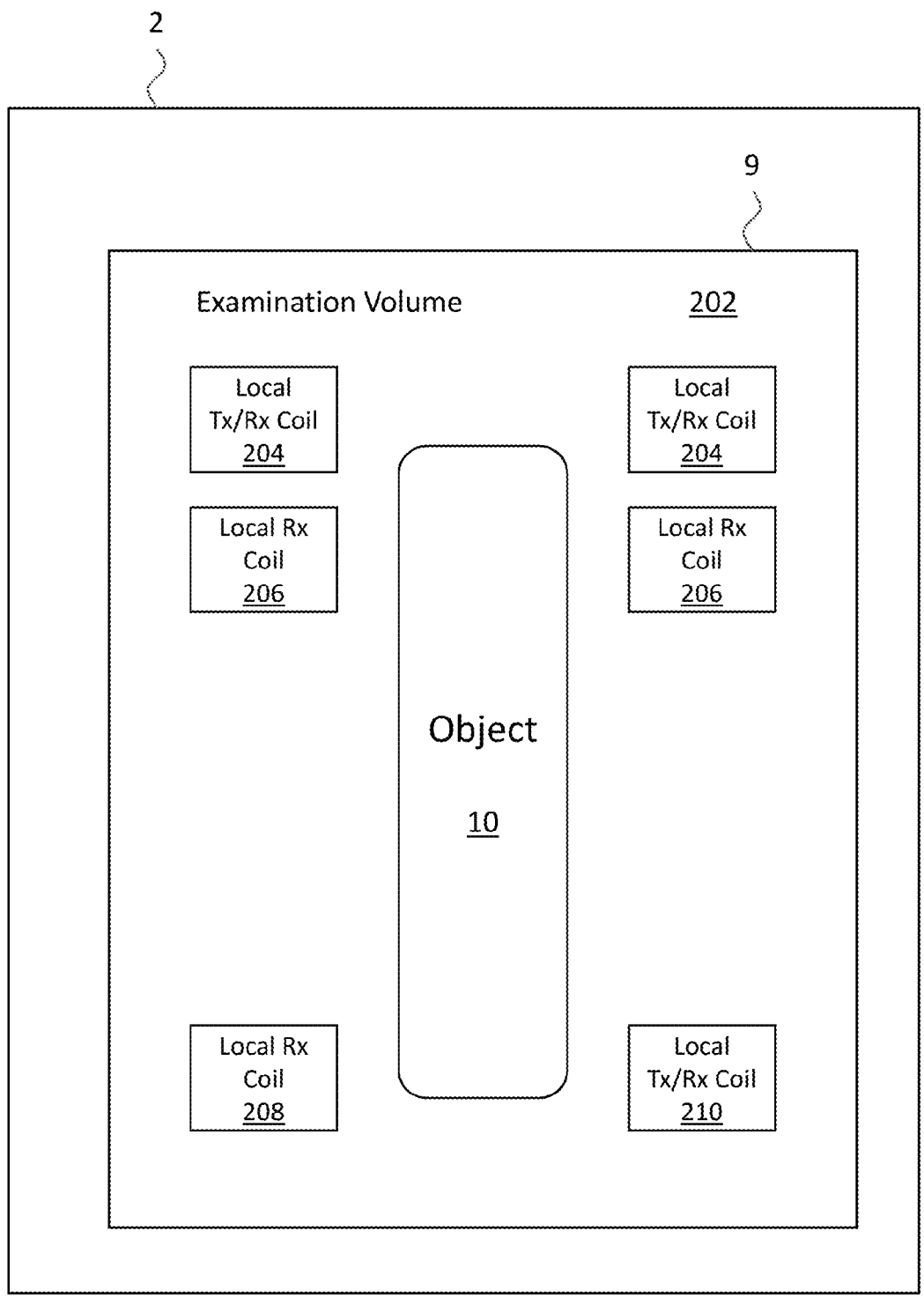
FIG. 2 illustrates a further schematic of an arrangement of local coils in order to carry out the method according to the invention.

FIG. 2 depicts an arrangement for characterizing the RF transmit chain of a magnetic resonance scanner 1 in more detail. Shown in FIG. 2 is the main magnet 200 which defines with its magnet bore an examination volume 202. Within the examination volume 202, an object 10 is placed in order to be imaged. Assuming that the object 10 is a human body which exhibits motion due to for example breathing, heartbeats or moving of the extremities of the body, such motions induce variations in the loading sensed by the external MR coil 9, which in the present case is an MR body coil. However, it has to be noted that also the array coils 11, 12 and 13 depicted in FIG. 1 may be used for the imaging purpose.

As mentioned above, the influence from the human physiology due to for example breathing results in variations that are at low frequency relative to the RF pulse timings. By monitoring the load variations induced due to the patient breathing, a respective feedback of the resulting change in the RF transmit specific phase to for example the RF amplifier by means of a feedback loop is required in real time.

For this purpose, sets of local transmit/receive coil systems 204 and local receive coil systems 206 are provided. The local transmit/receive coil systems 204 each comprise a local NMR probe (first local MR probe) and a first local magnetic resonance coil. The first NMR probe is spatially located in the immediate neighborhood to the first coil of the coil system 204. The term 'immediate neighborhood' may be understood for example as the coil encasing at least partially the local NMR probe. Further, preferably the distance between the probe and the coil is extremely small such that the excitation induced by the coil is only induced in the respective NMR probe.

Further shown in FIG. 2 is a local receive coil system 206 comprising a second local NMR probe and a second local magnetic resonance coil, wherein the second NMR probe is also spatially located in the immediate neighborhood to the second coil. In one embodiment shown in FIG. 2, the local transmit/receive coil system 204 and the local receive coil system 206 are positioned next to each other, such that every location is implemented as a 'twins' readout. In an alternative embodiment, two independent MFM systems constituted by a local transmitter receive coil system 210 and a local receive coil system 208 may be implemented at distinctly different locations which each probe the field response, wherein the RF response is derived from prior knowledge that relates the two probe systems 208 and 210.

In any case, a first MR signal phase evolution of the local RF transmit field generated by MR excitation of the first probe using the first magnetic resonance coil of the coil system 204 is determined by measuring the RF response of said first probe upon said excitation, wherein the measurement is performed also using the first magnetic resonance coil of the system 204.

Further, a second MR signal phase evolution of the local RF transmit field generated by MR excitation of the second probe of the system 206 using the whole body coil 9 is determined by measuring the RF response of the second probe upon said excitation, wherein the measurement is performed using the second magnetic resonance coil of the coil system 206.

Finally, the characterization of the RF transmit chain phase error of the whole body coil 9 is provided by calculating a phase offset between the first MR signal phase evolution and the second MR signal phase evolution.

In summary, two probes are employed, preferably at substantially the same location in the MR system, such that their responses are largely identical for any magnetic field effect. One of the probes is a local transmit/receive probe, wherein the other probe is excited using the whole body coil 9. Any differences in response between the two probe systems can be attributed to interference of the patient 10 with the body coil transmit system, i.e. the RF transmit chain of the body coil 9.

It has to be noted that in a preferred embodiment simultaneous excitation of both probe systems may be implemented. For calibration of the signal timings and phase evolution, it is advantageous to ensure same or constant ratio demodulation frequency

The invention claimed is:

1. A method of characterizing a radio frequency (RF) transmit chain of a magnetic resonance imaging scanner comprising:

a local transmit/receive coil system comprising a first probe and a first magnetic resonance coil, the first probe being spatially located in an immediate neighborhood of the first magnetic resonance coil, a local receive coil system comprising a second probe and a second magnetic resonance coil, the second probe being spatially located in an immediate neighborhood of the second magnetic resonance coil, wherein the RF transmit chain comprises an external magnetic resonance (MR) coil, the method comprising:

generating, with the first magnetic resonance coil, an MR excitation of the first probe;

measuring, with the first magnetic resonance coil, the RF response of the first probe to the MR excitation;

determining a first MR signal phase evolution of a first local RF transmit field from the RF response measured by the first magnetic resonance coil;

generating, with the external MR coil, an MR excitation of the second probe;

measuring, with the second magnetic resonance coil, the RF response of the second probe to the MR excitation;

determining a second MR signal phase evolution of a second local RF transmit field from the RF response measured by the second magnetic resonance coil; and calculating a phase offset between the first MR signal phase evolution and the second MR signal phase evolution that characterizes the RF transmit chain.

2. The method of claim 1, wherein the excitations of the first and second probes are performed simultaneously.

3. The method of claim 1, wherein nuclei excited using the first local RF transmit field differ from nuclei excited using the second local RF transmit field.

4. The method of claim 1, wherein:

the excitations of the first and second probes are performed sequentially, and the method further comprises monitoring timings of the excitations of the first and second probes and aligning the first and second MR signal phase evolutions using the excitation timings.

5. The method of claim 1, further comprising adjusting an RF frequency of the RF transmit chain for compensation of the phase offset.

6. The method of claim 1, wherein from the RF responses of the first and second probes, a level of electromagnetic coupling is derived between each of the first and second magnetic resonance coils and an object to be examined, each of the levels of electromagnetic coupling is compared to a pre-set threshold, the first magnetic resonance coil is deactivated when its level of coupling with the object exceeds the pre-set threshold, and the second magnetic resonance coil is deactivated when its level of coupling with the object exceeds the pre-set threshold.

7. The method of claim 1, wherein from the RF responses of the first and second probes, a level of electromagnetic coupling is derived for the first or second magnetic resonance coil when the respective one of the first and second magnetic resonance coils is deactivated.

8. The method of claim 6, wherein:

a magnetic resonance imaging sequence is applied which includes RF excitation pulses, and RF responses of the first and second probes o said RF excitation is measured.

9. The method of claim 1, wherein the first probe and the second probe are commonly provided as one single probe.

10. The method of claim 1, wherein the first coil and the second coil are commonly provided as one single RF coil.

11. The method of claim 1, wherein the characterization of the RF transmit chain is performed using an MR calibration sequence prior to the execution of an imaging sequence.

12. The method of claim 1, wherein the external MR coil comprises a parallel transmit coil.

13. The method of claim 1, wherein the first coil and second coil are spatially located in an immediate neighborhood of each other, or partially separated from each other, wherein the method further comprises virtually relating the first coil and second coil to each other.

14. An arrangement for characterizing the RF transmit chain of a magnetic resonance imaging scanner, the arrangement comprising:

a local transmit/receive coil system, comprising a first local NMR probe and a first local magnetic resonance coil, the first NMR probe being spatially located in immediate neighborhood to the first coil, a local receive coil system, comprising a second local NMR probe and a second local magnetic resonance coil, the second NMR probe being spatially located in immediate neighborhood to the second coil, wherein the transmit chain comprises an external MR coil, the arrangement being adapted for:

determining a first MR signal phase evolution of the local RF transmit field generated by MR excitation of the first probe using the first magnetic resonance coil by measuring the RF response of the first probe upon said excitation, the measurement being performed using the first magnetic resonance coil, determining a second MR signal phase evolution of the local RF transmit field generated by MR excitation of the second probe using the external MR coil by measuring the RF response of the second probe upon said excitation, the measurement being performed using the second magnetic resonance coil, providing the characterization of the RF transmit chain phase error by calculating a phase offset between the first MR signal phase evolution and the second MR signal phase evolution.

15. The arrangement of claim 14, wherein the excitations of the first and second probes are performed simultaneously.

16. The arrangement of claim 14, wherein:

the excitations of the first and second probes are performed sequentially, and the arrangement is further adapted for monitoring timings of the excitations of the first and second probes and aligning the first and second MR signal phase evolutions using the excitation timings.

17. The arrangement of claim 14, wherein the arrangement is further adapted for adjusting an RF frequency of the RF transmit chain for compensation of the phase offset.

18. The arrangement of claim 14, wherein the arrangement is further adapted for deriving, from the RF responses of the first and second probes, a level of electromagnetic coupling between each of the first and second magnetic resonance coils and an object to be examined, comparing each of the levels of electromagnetic coupling to a pre-set threshold, deactivating the first magnetic resonance coil when its level of coupling with the object exceeds the pre-set threshold, and deactivating the second magnetic resonance coil when its level of coupling with the object exceeds the pre-set threshold.

19. The arrangement of claim 14, wherein the arrangement is further adapted for deriving, from the RF responses of the first and second probes, a level of electromagnetic coupling for the first or second magnetic resonance coil when the respective one of the first and second magnetic resonance coils is deactivated.

20. The arrangement of claim 14, wherein the first probe and the second probe are commonly provided as one single probe.

* * * * *